(12) United States Patent
Wei et al.

(10) Patent No.: US 9,204,555 B2
(45) Date of Patent: Dec. 1, 2015

(54) METHOD OF ELECTROPLATING AND DEPOSITING METAL

(71) Applicant: Viking Tech Corporation, Hsinchu County (TW)

(72) Inventors: Shih-Long Wei, Hsinchu County (TW); Shen-Li Hsiao, Hsinchu County (TW); Chien-Hung Ho, Hsinchu County (TW)

(73) Assignee: Viking Tech Corporation, Hsinchu County (TW)

( * ) Notice: Subject to any disclaimer, the term of this patent is extended or adjusted under 35 U.S.C. 154(b) by 275 days.

(21) Appl. No.: 13/623,480

(22) Filed: Sep. 20, 2012

(65) Prior Publication Data

US 2014/0001051 A1    Jan. 2, 2014

(30) Foreign Application Priority Data

Jun. 29, 2012 (TW) .............................. 101123399 A

(51) Int. Cl.
| | | |
|---|---|---|
| *C25D 5/02* | (2006.01) | |
| *H05K 3/10* | (2006.01) | |
| *H05K 3/24* | (2006.01) | |
| *H05K 3/40* | (2006.01) | |
| *H05K 3/42* | (2006.01) | |

(52) U.S. Cl.
CPC ............... *H05K 3/108* (2013.01); *H05K 3/242* (2013.01); *H05K 3/4053* (2013.01); *H05K 3/42* (2013.01); *H05K 2201/0338* (2013.01); *H05K 2201/0347* (2013.01)

(58) Field of Classification Search
CPC ....................................................... C25D 5/02

USPC ........................................................ 205/118
See application file for complete search history.

(56) References Cited

U.S. PATENT DOCUMENTS

| | | | | |
|---|---|---|---|---|
| 4,440,823 A | * | 4/1984 | Hoffmann ..................... | 428/209 |
| 4,834,821 A | * | 5/1989 | Maligie ........................ | 156/152 |
| 4,958,216 A | * | 9/1990 | Tanaka et al. ................. | 257/632 |
| 6,322,684 B1 | * | 11/2001 | Hodko et al. ................. | 205/125 |
| 6,596,624 B1 | * | 7/2003 | Romankiw .................... | 438/619 |
| 2005/0062160 A1 | * | 3/2005 | Naito et al. ................... | 257/755 |
| 2011/0061234 A1 | * | 3/2011 | Hsu et al. ........................ | 29/846 |

* cited by examiner

*Primary Examiner* — Keith Hendricks
*Assistant Examiner* — Stefanie S Wittenberg
(74) *Attorney, Agent, or Firm* — Davis & Bujold, P.L.L.C.; Michael J. Bujold

(57) ABSTRACT

A method of electroplating and depositing metal includes: providing an insulation substrate formed with conductive through holes; forming a first conductive layer on a first surface of the insulation substrate and forming a resist layer on a first portion of the first conductive layer, leaving a second portion of the first conductive layer uncovered by the resist layer as a to-be-plated area; disposing the insulation substrate in a first electroplating solution and depositing a first metal layer on the to-be-plated area; removing the resist layer and the portion of the first conductive layer; forming a second conductive layer on a second surface of the insulation substrate; forming a mask layer on the second conductive layer; disposing the insulation substrate in a second electroplating solution and depositing a second metal layer on the first metal layer of the to-be-plated area; and removing the mask layer and the second conductive layer.

10 Claims, 8 Drawing Sheets

METHOD OF ELECTROPLATING AND DEPOSITING METAL

BACKGROUND OF THE INVENTION

1. Field of the Invention

The present invention relates to electroplating technology, and, more particularly, to a method of depositing metal on an insulation substrate.

2. Description of Related Art

In the conventional electroplating on an insulation substrate, the critical step of forming a metallization pattern is that a position to be formed with a metallization pattern on an insulation substrate needs to be electrically connected to a cathode (a negative electrode) performing a reduction such that metal ions in electroplating solution are deposited on the insulation substrate via the reduction. For example, if copper is to be electroplated on the specific position of an insulation substrate, the portion of the insulation substrate that is not be electroplated with copper is masked. Then the insulation substrate is placed in electroplating solution. The specific position of the insulation substrate is electrically connected to a negative electrode, and copper ions are then reduced on the specific position of the insulation substrate to form a metallization pattern.

In the electroplating technology, there are acidic and basic electroplating solutions, and the acidic electroplating solution is better for usage due to its compatibility. In the prior art, the resist layer, such as a dry film or a photoresist, has anti-acid property but has no anti-alkali property. In the basic electroplating solution, the dry film or the photoresist has poor attachment. Currently, electroplating with leading wires and cured resist layer are used in the basic electroplating solution for electroplating.

FIG. 1A to FIG. 1G are sectional views illustrating conventional metal deposition in the electroplating solution by using leading wires according to the prior art. As shown, a conductive layer 2 is sputtered on an insulation substrate 1, a resist layer 3 is applied to form a pattern 30 to be plated, and a leading wire 31 (shown in FIG. 1C') is provided. In the electroplating of Cu, Ni and Ag, the acidic electroplating solution is used for electroplating Cu, and the basic electroplating solution is used for electroplating Ag, such that the two electroplating procedures need to be performed separately. The insulation substrate 1 is then placed in the acidic electroplating solution, and the resist layer 3 has anti-acid property and thus has desired attachment property to the substrate. After the copper 4 is deposited on the pattern 30 and on the leading wire 31 of the insulation substrate 1, the resist layer 3 and the exposed conductive layer 2 are removed. Then, as shown in FIG. 1G, the electroplating of Ni and Ag is performed respectively. For this process, the resist layer 3 has no anti-alkali property and thus needs to be removed, and the pattern 30 is electrically connected to the negative electrode via the leading wire 31, so as to complete the deposition of the Ni and Ag 5. In order to selectively plate a metal layer on the surface of the insulation substrate 1 in the basic electroplating solution, the metallization structure of the insulation substrate 1 includes the pattern 30 and the leading wire 31 which is electrically connected to the pattern 30. When the leading wire 31 having Cu, Ni and Ag between the two patterns 30 is formed, a dicing blade or laser light would be affected by the leading wire 31 during cutting and thus the blade edge may be destroyed once it is in touch with metal or the energy of laser spot is reflected by the leading wire 31 without absorption from the insulation substrate 1. Therefore, these two cutting machines will fail to completely separate the insulation substrate 1. Further, the patterns 30 are electrically connected to one another by the leading wire 31, such that the open circuit or short circuit test of each of the patterns 30 on the insulation substrate 1 cannot be performed due to the electrical connection formed by the leading wire 31.

FIG. 2 is a sectional view showing a cured resist layer for the electroplating according to the prior art. The electroplating shown in FIG. 2 is similar to that in FIG. 1. An insulation substrate 1 is provided, a conductive layer 2 and a resist layer 3 are formed to construct a pattern 30 to be plated (as shown in FIG. 2C') and the electroplating is performed in the acidic electroplating solution to form the copper 4. At this time, the resist layer 3 is not removed and the resist layer 3 is cured by baking (as shown in FIGS. 2D and 2E, the resist layer 3 is cured to be the resist layer 3'). The electroplating of the nickel layer is subsequently performed, and then the substrate is provided in the basic electroplating solution, so as to form the deposition of the silver 5. In this method, the cured resist layer 3' has a little anti-alkali property, such that it is necessary for the electroplating to be completed in a short period of time. For example, upon the development of the dry film the baking is performed before electroplating, or upon the development of the dry film the hard baking is formed to enhance curing, so as to improve the anti-alkali property of the dry film. However, this method has poor stability, and peeling of the resist layer may occur in the basic electroplating solution since the basic solution, NaOH, for example, is just used for removing the resist layer. Moreover, during removing the over cured resist layer 3', residual films may stay in slots between metals. It is hard to completely clean those residual films.

Briefly, the metal electroplating in the basic solution should be further improved. Conventional leading wire method may cause a big problem during the cutting process with a dicer or a laser. On the other hand, using cured resist layer in the basic electroplating cannot provide a stable yield in production due to the film residue. There is a need to improve the electroplating in the basic electroplating solution, so as to simplify the processing and reduce the cost.

SUMMARY OF THE INVENTION

The present invention provides a method for electroplating and depositing metal in an acidic or basic electroplating solution via a conductive layer and a mask layer.

In accordance with the present invention, the method includes: providing an insulation substrate formed with a plurality of conductive through holes; forming a first conductive layer on a first surface of the insulation substrate, forming a resist layer on a portion of the first conductive layer, and leaving a second portion of the first conductive layer uncovered by the resist layer as a to-be-plated area; disposing the insulation substrate in a first electroplating solution and depositing a first metal layer on the to-be-plated area; removing the resist layer and the first portion of the first conductive layer; forming a second conductive layer on a second surface of the insulation substrate opposing the first surface, and forming a mask layer on the second conductive layer; disposing the insulation substrate in a second electroplating solution and depositing a second metal layer on the first metal layer of the to-be-plated area; and removing the mask layer and the second conductive layer.

In accordance with the present invention, it is not necessary to perform metal deposition in the first electroplating solution with an acidic electroplating solution. In other words, the metal electroplating-deposition method of the present invention is capable of being applicable to an acidic electroplating solution or a basic electroplating solution. For example, the first electroplating solution is an acidic electroplating solution, and the second electroplating solution is a basic or acidic electroplating solution.

In an embodiment of the present invention, the conductive through hole is made of silver conductive paste or copper.

In another embodiment of the present invention, the second metal layer is deposited in the to-be-plated area by electrically connecting the conductive through hole and the second conductive layer to a cathode of an electroplating system, and thus the second metal layer is an electroplated nickel layer and an electroplated silver layer.

In another embodiment of the present invention, the mask layer is a plating resist tape or a tooling fixture for preventing the electroplating solution from penetration.

In addition, the present invention further provides a method of electroplating and depositing metal, including: providing an insulation substrate formed with a plurality of conductive through holes; forming a first metal layer on a first surface of the insulation substrate and forming a second conductive layer on a second surface of the insulation substrate opposing the first surface; forming a mask layer on the second conductive layer; disposing the insulation substrate in an electroplating solution and depositing a second metal layer on the first metal layer; and removing the mask layer and the second conductive layer.

In the method of electroplating and depositing metal according to the present invention, the reduction deposition is performed based on the electrical interconnection of both surfaces of the insulation substrate, and both the acidic electroplating solution and the basic electroplating solution can be used. In comparison with the prior art of exposed leading wires or cured resist layers, the method of electroplating and depositing metal according to the present invention can be performed stably in acidic or basic electroplating solution and has an improved yield and reduced cost.

DETAILED DESCRIPTION OF THE PREFERRED EMBODIMENTS

The following specific examples are used for illustrating the present invention. A person skilled in the art can easily conceive the other advantages and effects of the present invention.

FIGS. 3A to 3L are sectional views illustrating electroplating metal in an electroplating solution according to a method of electroplating and depositing metal of the present invention. The method of the present invention can be practiced in an acidic electroplating solution or a basic electroplating solution. In an embodiment of the present invention, the electroplating of copper is performed in the acidic electroplating solution, and the electroplating of silver is performed in the basic electroplating solution. In accordance with the present invention, the metal and electroplating solution are not limited to those described in the embodiments.

Figure 3A:
FIGS. 3A to 3L are sectional views illustrating electroplating metal in an electroplating solution according to the present invention.

As shown in FIG. 3A, an insulation substrate 10 having a first surface and a second surface opposing to the first surface is provided. The insulation substrate 10 can be made of aluminum nitride or aluminum oxide.

Figure 3B:
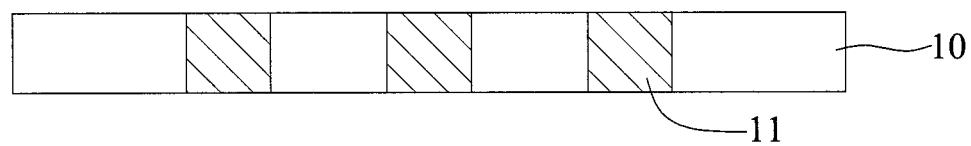

As shown in FIG. 3B, a conductive through hole 11 is formed in a specific position of the insulation substrate 10, and can be made of a silver conductive paste or a copper. In an embodiment, the conductive through hole 11 is used as the electrical connection between the first surface and the second surface of the insulation substrate 10 while filling the silver conductive paste or electroplating copper.

Figure 3C:
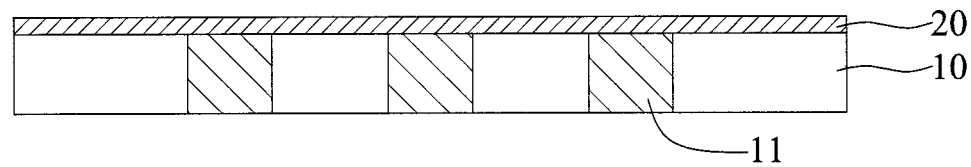

As shown in FIG. 3C, a first conductive layer 20 is formed on the first surface of the insulation substrate 10, and includes a titanium layer and a copper layer formed by sputtering.

Figure 3D:
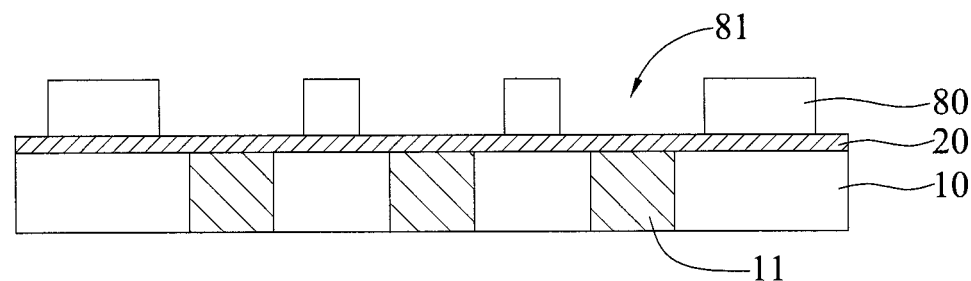
Figure 3D:
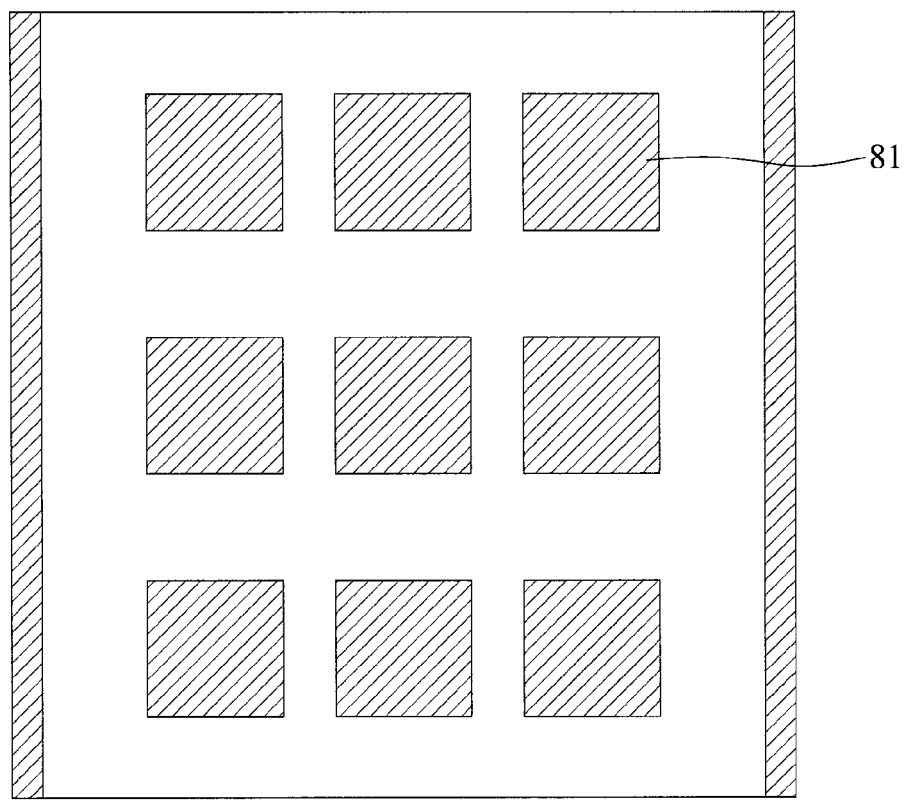

As shown in FIG. 3D, a resist layer 80 is formed on the first surface of the insulation substrate 10, and a portion of the first conductive layer 20 that is not covered by the resist layer 80 is used as a to-be-plated area 81. The resist layer 80 may be a dry film or a photoresist for covering a portion of the first conductive layer 20 that is not to be electroplated. In other words, the resist layer 80 is formed on a specific position of the first surface according to the pattern to be plated, and the portion, which is to be plated, is the to-be-plated area 81. FIG. 3D' shows the top view of the sectional view shown in FIG. 3D, wherein the to-be-plated area 81 is an area where metal is electroplated and deposited.

Figure 3E:
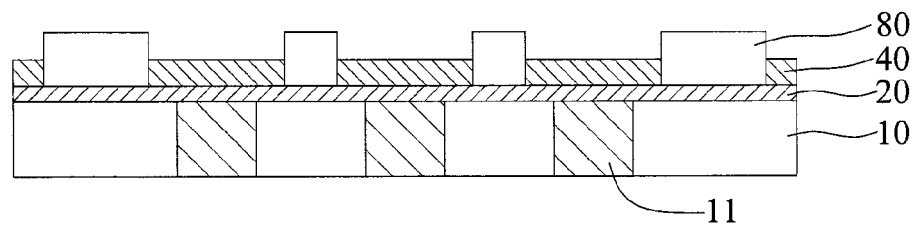

As shown in FIG. 3E, the insulation substrate 10 shown in FIG. 3D is disposed in the acidic electroplating solution, and then a first metal layer 40 is deposited in the to-be-plated area 81. Due to the operation in the acidic electroplating solution, the first metal layer 40 can be the electroplated copper layer.

Figure 3F:
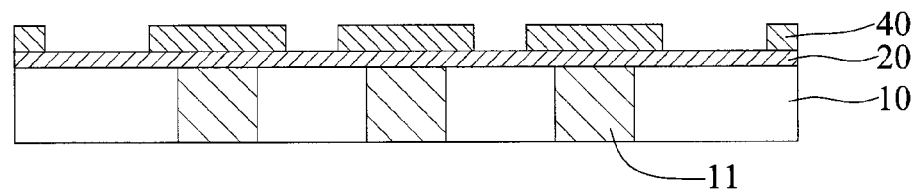

As shown in FIG. 3F, the resist layer 80 in FIG. 3E is removed. In the prior art, since the resist layer 80 has no anti-alkali property, the cured resist layer used for electroplating in the basic electroplating results in residual films in slots between metals. In an embodiment of the present invention, the resist layer 80 is not formed by curing, and thus will not be peeled off in the basic electroplating solution or stay in slots between metals.

Figure 3G:
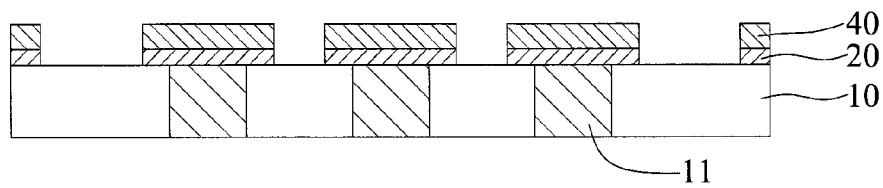

As shown in FIG. 3G, the first conductive layer 20 under the resist layer 80, i.e., a portion of the first conductive layer 20 exposed from the first surface, is removed, such that the first metal layer 40 is electrically isolated. In other words, after removing the resist layer 80, the exposed first conductive layer 20 is removed, such that the first metal layer 40 cannot be electrically connected to one another via the first conductive layer 20, so as to facilitate the open circuit or short circuit test of an electroplated pattern formed by the first metal layer 40.

Figure 3H:
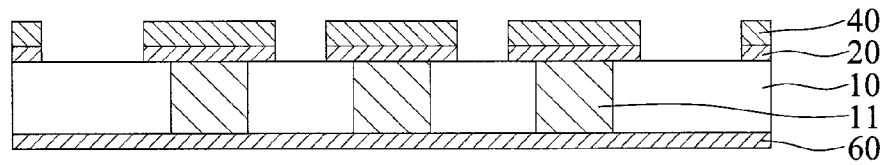

As shown in FIG. 3H, a second conductive layer 60 is formed on a second surface of the insulation substrate 10 opposing the first surface. In an embodiment, the second conductive layer 60 can be a copper layer only formed by sputtering.

Figure 3I:
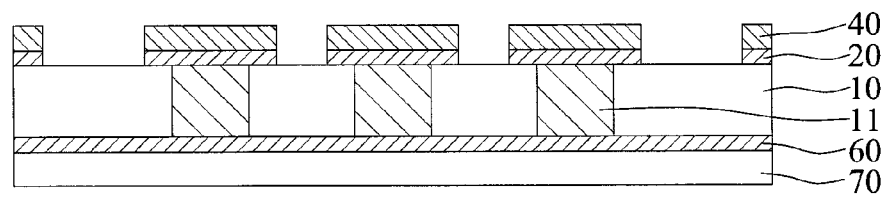

As shown in FIG. 3I, a mask layer 70 is formed on the second conductive layer 60 of the second surface of the insulation substrate 10, so as to prevent the second conductive layer 60 on the second surface from being exposed and to prevent metals from being deposited on the second surface during electroplating. The mask layer 70 may be a plating resist tape or a tooling fixture for preventing the electroplating solution from penetration.

Figure 3J:
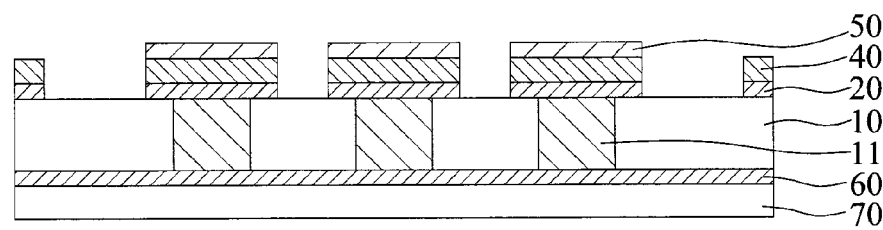

As shown in FIG. 3J, the insulation substrate 10 in FIG. 3I is placed in a basic electroplating solution, and then a second metal layer 50 is deposited on the first metal layer 40 in the to-be-plated area 81. The conductive through holes 11 and the second conductive layer 60 are used for electrically connecting the negative electrode (cathode) of the electroplating system, and thus metal ions are deposited on the first metal layer 40, such that the second metal layer 50 is deposited. Since the operation is performed in the basic electroplating solution, the second metal layer 50 may be the electroplated silver layer.

Referring to FIG. 3J, in another embodiment of the present invention, the insulation substrate 10 is placed in an acidic electroplating solution, a barrier layer (not shown) is formed on the first metal layer 40 in the to-be-plated area 81, such as nickel electroplating, then the insulation substrate 10 is placed in a basic electroplating solution, and silver is deposited on the electroplated nickel layer. In other words, the second metal layer 50 includes the electroplated nickel layer and silver layer.

Figure 1A:
FIGS. 1A to 1G are sectional views illustrating electroplating metal in an electroplating solution with a leading wire according to the prior art.
Figure 1B:
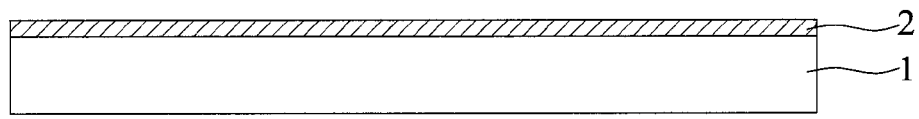
Figure 1C:
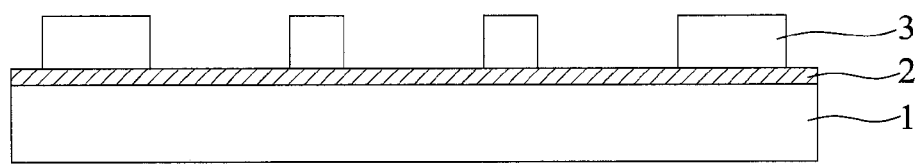
Figure 1C:
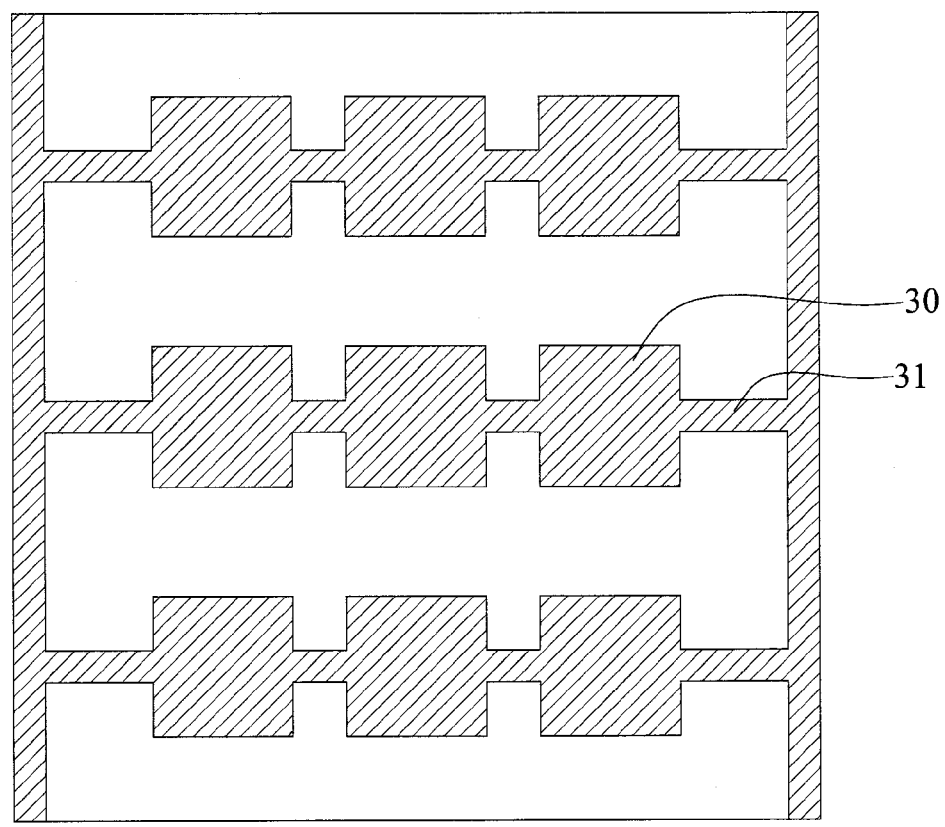
Figure 1D:
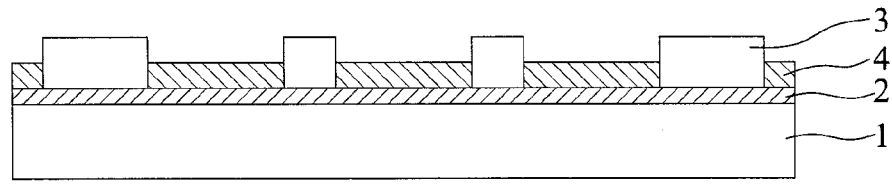
Figure 1E:
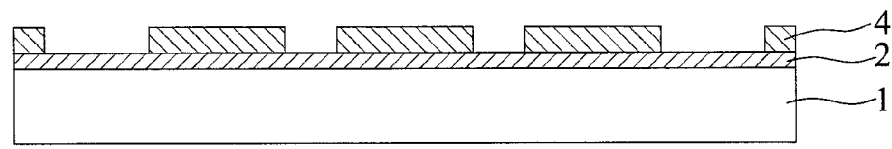
Figure 1F:
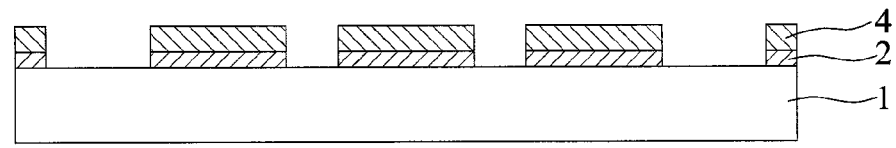
Figure 1G:
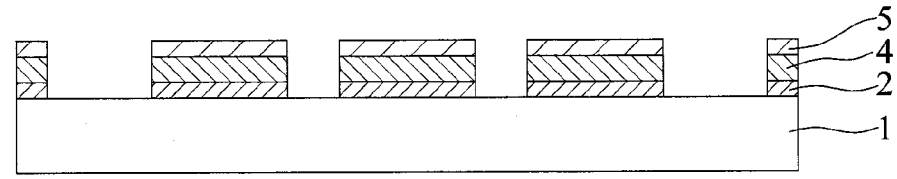
Figure 2A:
FIGS. 2A to 2H are sectional views illustrating electroplating metal in an electroplating solution with a cured resist layer according to the prior art.
Figure 2B:
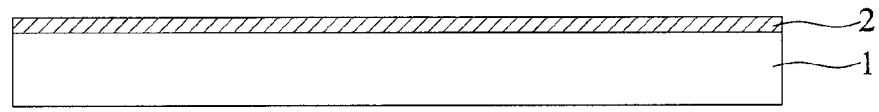
Figure 2C:
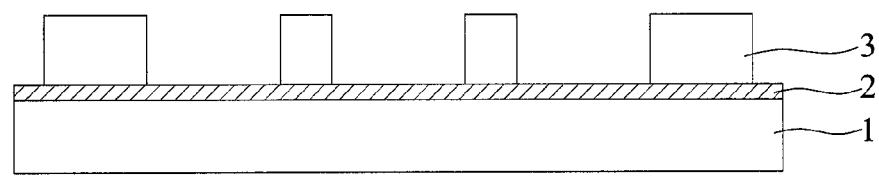
Figure 2C:
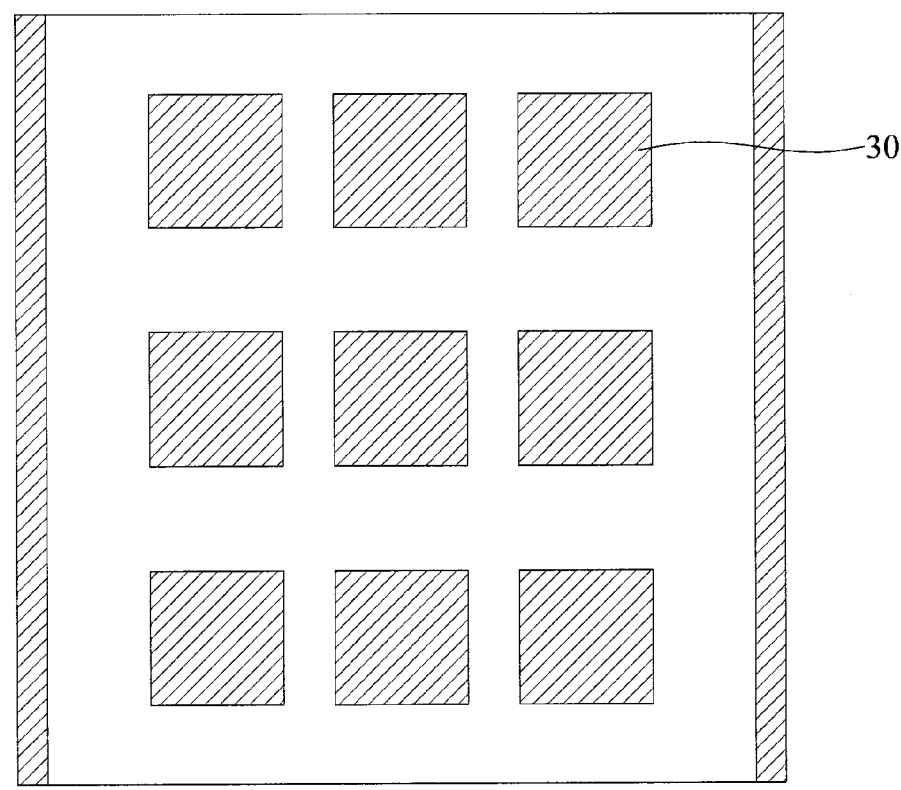
Figure 2D:
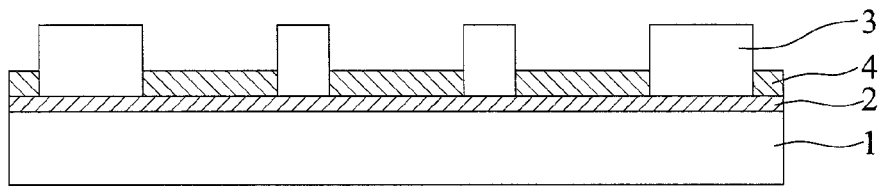
Figure 2E:
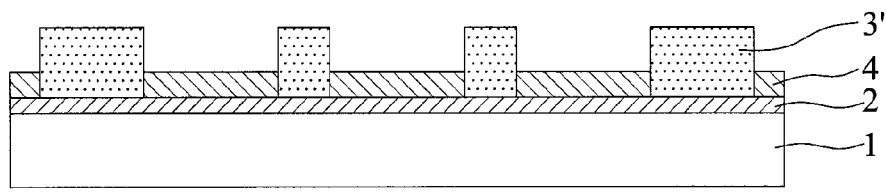
Figure 2F:
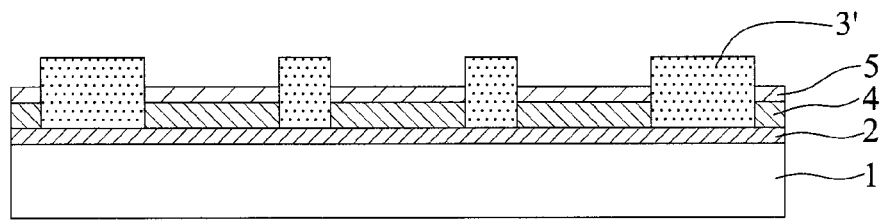
Figure 2G:
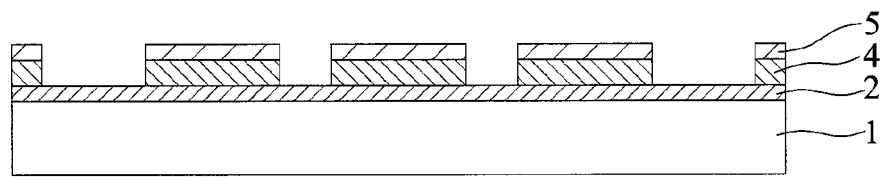
Figure 2H:
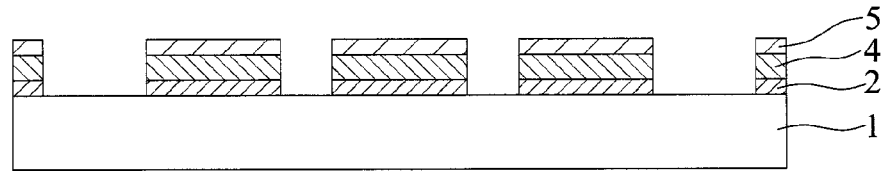
Figure 3K:
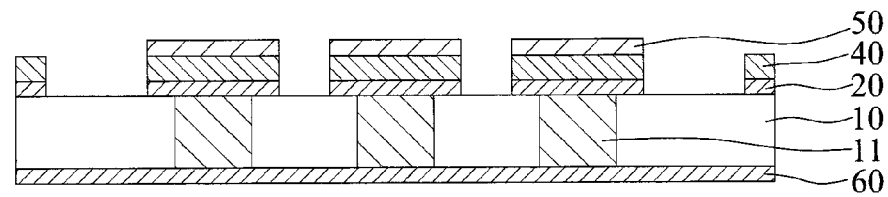
Figure 3L:
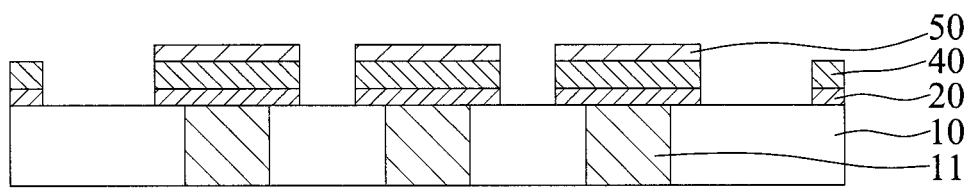

As shown in FIGS. 3K and 3L, the mask layer 70 and the second conductive layer 60 are removed. The second metal layer 50 is formed on the first metal layer 40, and the structure is similar to the structures shown in FIGS. 1G and 2H.

In another embodiment of the present invention, an insulation substrate with a conductive through hole is provided, a first metal layer is formed on a first surface of the insulation substrate, a second conductive layer is formed on a second surface of the insulation substrate opposing the first surface, a mask layer is formed on the second conductive layer, the insulation substrate is placed in a second electroplating solution, a second metal layer is deposited on the first metal layer, and the mask layer and the second conductive layer are removed. In an embodiment of the present invention, the insulation substrate with the first metal layer is provided (as shown in FIG. 3G), and then the procedures shown in FIGS. 3H to 3L are performed, so as to complete the method of electroplating and depositing metal according to the present invention. In an embodiment, the first metal layer and the second metal layer are not limited to be formed in sequence, and the insulation substrate having a metal layer can be used in the method of electroplating and depositing metal according to the present invention.

In the method of electroplating and depositing metal according to the present invention, the insulation substrate can be used in the acidic or basic electroplating solution for electroplating, wherein the second conductive layer and the mask layer are formed for electrical connection, electrons from the negative electrode are coupled with metal ions on the surface of the first metal layer via the second conductive layer, the conductive through hole, the first conductive layer and the first metal layer, and thus the metals are deposited on the surface of the first metal layer. Therefore, metal layers can be sequentially formed on both surfaces of the insulation substrate by using the present invention, so as to eliminate the drawbacks resulting from using the conventional leading wires and cured resist layers.

Hence, in the method of electroplating and depositing metal according to the present invention, the reduction deposition is performed based on the electrical interconnection of both surfaces of the insulation substrate, and both the acidic electroplating solution and the basic electroplating solution can be used. In comparison with the prior art of exposed leading wires or cured resist layers, the method of electroplating and depositing metal according to the present invention can be performed stably in acidic or basic electroplating solution and has an improved yield and reduced cost.

The invention has been described using exemplary preferred embodiments. However, it is to be understood that the scope of the invention is not limited to the disclosed arrangements. The scope of the claims, therefore, should be accorded the broadest interpretation, so as to encompass all such modifications and similar arrangements.

What is claimed is:

1. A method, comprising:
providing an insulation substrate formed with a plurality of conductive through holes;
forming a first conductive layer on a first surface of the insulation substrate and forming a resist layer on a first portion of the first conductive layer, leaving a second portion of the first conductive layer uncovered by the resist layer as a to-be-plated area:
disposing the insulation substrate in a first electroplating solution and depositing a first metal layer on the to-be-plated area,
after depositing the first metal layer on the to-be-plated area, removing the resist layer and the first portion of the first conductive layer;
after removing the resist layer and the first portion of the first conductive layer, forming a second conductive layer on a second surface of the insulation substrate that opposes the first surface, and forming a mask layer on the second conductive layer;
disposing the insulation substrate in a second electroplating solution and depositing a second metal layer on the first metal layer of the to-be-plated area, and
removing all of the mask layer and the second conductive layer.

2. The method of claim 1, wherein the insulation substrate is made of aluminum nitride or aluminum oxide.

3. The method of claim 1, wherein the conductive through holes are made of silver conductive paste or copper.

4. The method of claim 1, wherein the first conductive layer is formed by a titanium layer and a copper layer through sputtering.

5. The method of claim 1, wherein the resist layer is a dry film or a photoresist.

6. The method of claim 1, wherein the first metal layer is a copper layer.

7. The method of claim 1, wherein the second conductive layer is a copper layer formed by sputtering.

8. The method of claim 1, wherein depositing a second metal layer on the first metal layer of the to-be-plated area is performed through the conductive through holes and the second conductive layer that are electrically connected to a cathode of an electroplating system to deposit an electroplating nickel layer and a silver layer as the second metal layer.

9. The method of claim 1, wherein the mask layer is a plating resist tape or a tooling fixture for preventing the electroplating solution from penetration.

10. The method of claim 1, wherein the first electroplating solution is an acidic electroplating solution, and the second electroplating solution is a basic or acidic electroplating solution.

* * * * *